(12) United States Patent
Hayashi et al.

(10) Patent No.: US 9,811,096 B2
(45) Date of Patent: Nov. 7, 2017

(54) LIQUID FEEDING DEVICE AND SUBSTRATE TREATING DEVICE

(71) Applicant: SHIBAURA MECHATRONICS CORPORATION, Yokohama-shi, Kanagawa (JP)

(72) Inventors: Konosuke Hayashi, Yokohama (JP); Takashi Ootagaki, Yokohama (JP); Emi Matsui, Yokohama (JP)

(73) Assignee: SHIBAURA MECHATRONICS CORPORATION, Kanagawa (JP)

(*) Notice: Subject to any disclaimer, the term of this patent is extended or adjusted under 35 U.S.C. 154(b) by 0 days.

(21) Appl. No.: 14/939,008

(22) Filed: Nov. 12, 2015

(65) Prior Publication Data
US 2016/0062372 A1    Mar. 3, 2016

Related U.S. Application Data

(63) Continuation of application No. PCT/JP2014/062878, filed on May 14, 2014.

(30) Foreign Application Priority Data

May 14, 2013 (JP) ................. 2013-102460

(51) Int. Cl.
G05D 11/13 (2006.01)
B05B 12/00 (2006.01)
(Continued)

(52) U.S. Cl.
CPC ............ *G05D 11/13* (2013.01); *B05B 12/006* (2013.01); *B05C 5/02* (2013.01); *G05D 9/12* (2013.01);
(Continued)

(58) Field of Classification Search
None
See application file for complete search history.

(56) References Cited

U.S. PATENT DOCUMENTS

2003/0159713 A1    8/2003    Park

FOREIGN PATENT DOCUMENTS

| CN | 1441466 A | 9/2003 | |
| JP | H06-002347 A * | 1/1994 | ............. E03B 11/10 |

(Continued)

OTHER PUBLICATIONS

International Preliminary Report on Patentability mailed in corresponding International Patent Application No. PCT/JP2014/062878 dated Nov. 26, 2015, consisting of 7 pages.

(Continued)

*Primary Examiner* — Dah-Wei D Yuan
*Assistant Examiner* — Jethro M Pence
(74) *Attorney, Agent, or Firm* — Volpe and Koenig, P.C.

(57) ABSTRACT

A liquid feeding device that feeds a treatment liquid to a treating device and also recovers the treatment liquid for re-feeding, include feeding tanks having an exhaust passage and an overflow line, and can be switched to one of a feeding mode in which the treatment liquid is fed and a standby mode in which the feeding tank is on standby while accommodating the treatment liquid; a feeding mechanism that feeds the treatment liquid to the treating device from the feeding tank in the feeding mode among the plurality of feeding tanks; a recovery mechanism that recovers and returns the treatment liquid excessive in the treatment device to the feeding tank in the feeding mode; and an on-off mechanism provided in each of the plurality of feeding tanks to block the exhaust passage and the overflow line is provided.

12 Claims, 2 Drawing Sheets

(51) Int. Cl.
G05D 9/12 (2006.01)
B05C 5/02 (2006.01)
H01L 21/67 (2006.01)
B05B 13/02 (2006.01)

(52) U.S. Cl.
CPC .... *H01L 21/6708* (2013.01); *H01L 21/67017* (2013.01); *B05B 13/0242* (2013.01)

(56) References Cited

FOREIGN PATENT DOCUMENTS

| | | | | |
|---|---|---|---|---|
| JP | H062347 A | | 1/1994 | |
| JP | 11147035 A | | 6/1999 | |
| JP | 11165116 A | | 6/1999 | |
| JP | H11-147035 A | * | 6/1999 | ........... H01L 21/027 |
| JP | 2003-297795 A | * | 10/2003 | ....... H01L 21/02052 |
| JP | 2003297795 A | | 10/2003 | |
| JP | 2006326855 A | | 12/2006 | |
| JP | 2007319948 A | | 12/2007 | |
| JP | 2010010555 A | | 1/2010 | |

OTHER PUBLICATIONS

International Search Report mailed in corresponding International Patent Application No. PCT/JP2014/062878 dated Aug. 19, 2014, consisting of 5 pp. (English translation provided).
Office Action mailed in corresponding Japanese Patent Application No. 2015-517119 dated Aug. 23, 2016, consisting of 8 pp.
Office Action mailed in corresponding Chinese Patent Application No. 201480027435.3 dated Jan. 23, 2017, consisting of 21 pp. (English Translation Provided).

* cited by examiner

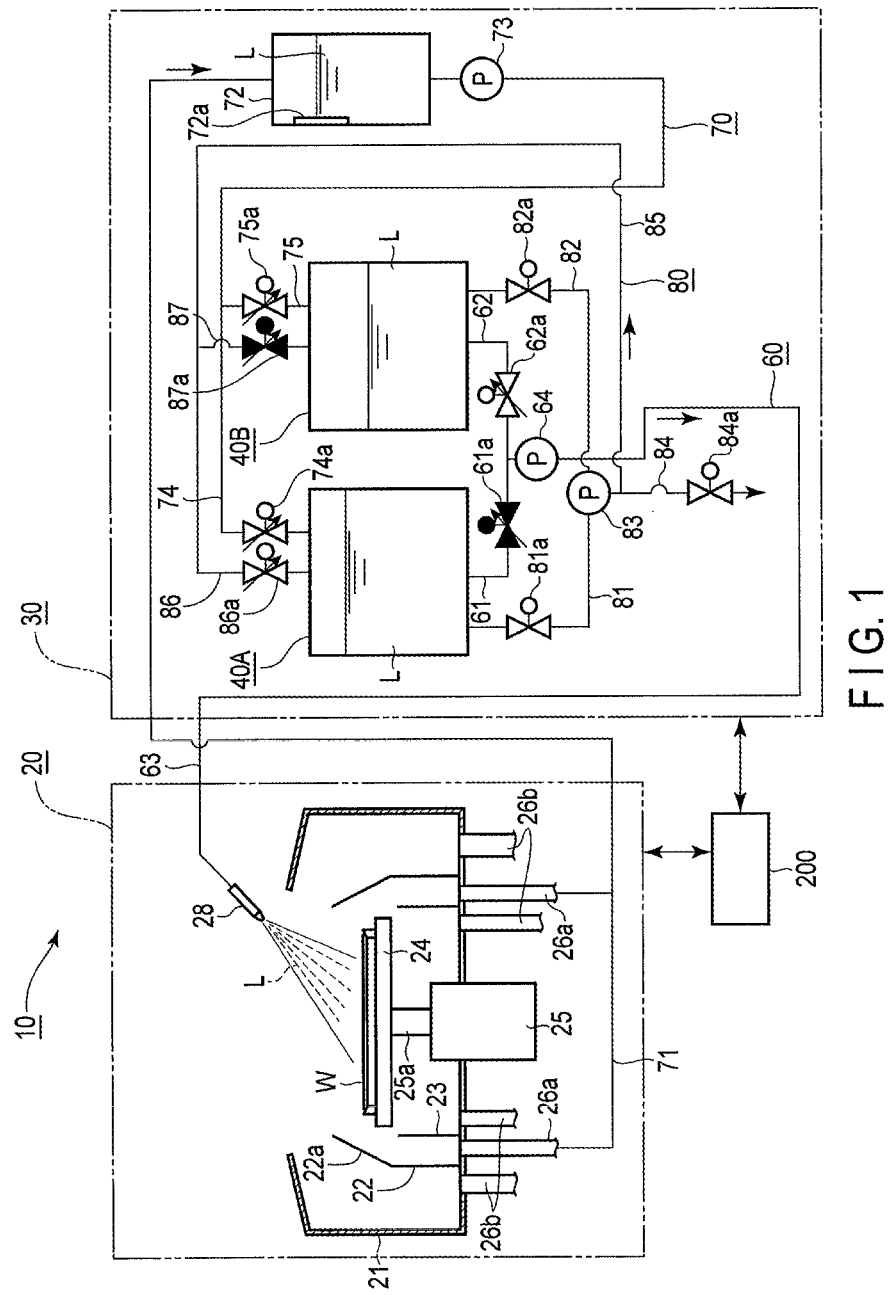
F I G. 1

LIQUID FEEDING DEVICE AND SUBSTRATE TREATING DEVICE

CROSS-REFERENCE TO RELATED APPLICATION

This application is based upon and claims the benefit of priority from the prior Japanese Patent Application No. 2013-102460, filed May 14, 2013; and PCT Application No. PCT/JP2014/062878, filed May 14, 2014 the entire contents both of which are incorporated herein by reference.

TECHNICAL FIELD

The present invention relates to a liquid feeding device that feeds a treatment liquid to a substrate or the like and a substrate treating device into which such a liquid feeding device is integrated.

BACKGROUND ART

In the manufacturing process of, for example, a liquid crystal display or a semiconductor device, a circuit pattern is formed on a substrate such as a glass substrate having a rectangular shape or a semiconductor wafer (see, for example, Jpn. Pat. Appln. KOKAI Publication No. 2010-010555). When a circuit pattern is formed, development and an etching process of a substrate and peeling of a resist are performed by a substrate treating device. A treatment liquid used to treat a substrate is prepared and stored in a feeding tank of a liquid feeding device to feed the treatment liquid to the substrate when needed. Such a treatment liquid is expensive and so is returned to the feeding tank again after being separated and recovered.

For example, two feeding tanks are provided to a liquid feeding device and one tank is used at a time. The treatment liquid in the feeding tank not in use is periodically circulated by a pump. Because the treatment liquid is degraded with the passage of time or with use, a life time is set and the treatment liquid is disposed of when degraded.

The feeding tank is provided with an exhaust passage in an upper portion thereof and an overflow line on the side thereof and these passages are open. The exhaust passage is provided to prevent a negative pressure inside the feeding tank when a treatment liquid is fed from the feeding tank to a substrate by a pump and the overflow line is provided to prevent a treatment liquid inside the feeding tank from exceeding a fixed liquid level.

DISCLOSURE OF INVENTION

An object of the present invention is to provide a liquid feeding device and a substrate treating device which are capable of prolonging the life of a treatment liquid by preventing degradation of the treatment liquid in a standby state by being accommodated in a feeding tank.

A liquid feeding device that feeds a treatment liquid to a treating device and also recovers the treatment liquid for re-feeding, the device comprises a plurality of feeding tanks that accommodate the treatment liquid, include an exhaust passage and an overflow line, and can be switched to one of a feeding mode in which the treatment liquid is fed and a standby mode in which the feeding tank is on standby while accommodating the treatment liquid, a feeding mechanism that feeds the treatment liquid to the treating device from the feeding tank in the feeding mode among the plurality of feeding tanks; a recovery mechanism that recovers and returns the treatment liquid excessive in the treatment device to the feeding tank in the feeding mode; and an on-off mechanism provided in each of the plurality of feeding tanks to block the exhaust passage and the overflow line.

A substrate treating device that treats a substrate with a treatment liquid, the device comprises a rotation table driven to rotate while holding the substrate freely removably, a feeding portion arranged above the rotation table to feed the treatment liquid to the substrate, a recovery portion arranged below the rotation table to recover the treatment liquid; a plurality of feeding tanks that accommodate the treatment liquid, include an exhaust passage and an overflow line, and can be switched to one of a feeding mode in which the treatment liquid is fed and a standby mode in which the feeding tank is on standby while accommodating the treatment liquid, a feeding mechanism that feeds the treatment liquid to the treating device from the feeding tank in the feeding mode among the plurality of feeding tanks, a recovery mechanism that recovers and returns the treatment liquid remaining in the treatment device to the feeding tank in the feeding mode, and an on-off mechanism provided in each of the plurality of feeding tanks to block the exhaust passage and the overflow line.

According to the present invention, the life of a treatment liquid in a standby state by being accommodated in a feeding tank can be prolonged.

BRIEF DESCRIPTION OF DRAWINGS

FIG. 1 is an explanatory view showing the configuration of a substrate treating device into which a liquid feeding device according to an embodiment of the present invention is integrated.

DESCRIPTION OF EMBODIMENTS

Figure 2:
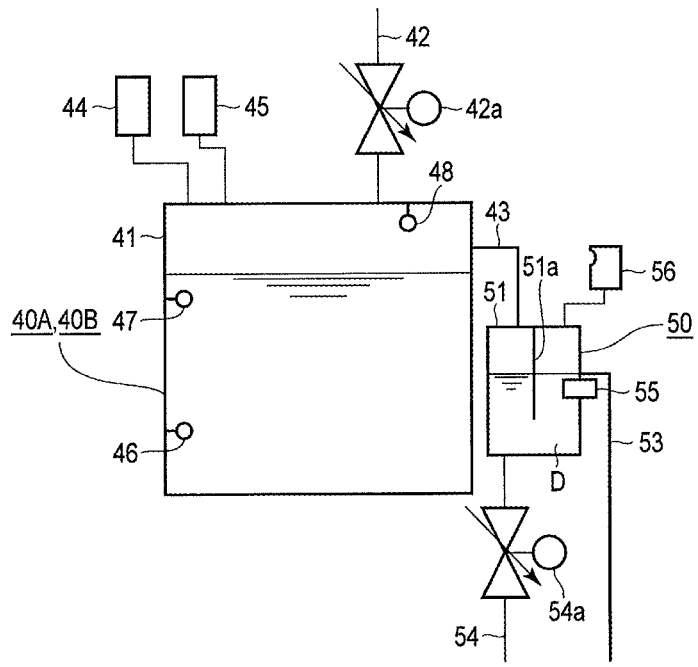
FIG. 2 is an explanatory view showing the configuration of a feeding tank integrated into the liquid feeding device.
Figure 3:
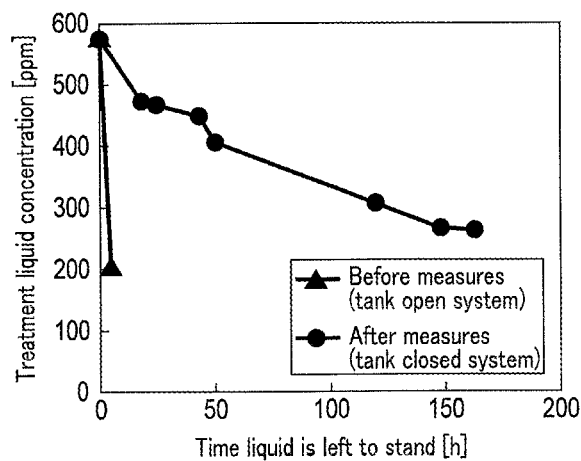
FIG. 3 is an explanatory view showing an example of a liquid seal effect by the liquid feeding device.

FIG. 1 is an explanatory view showing the configuration of a substrate treating device 10 into which a liquid feeding device 30 according to an embodiment of the present invention is integrated, FIG. 2 is an explanatory view showing the configuration of feeding tanks 40A, 40B integrated into the liquid feeding device 30, and FIG. 3 is an explanatory view showing an example of a liquid seal effect by the liquid feeding device 30. In these diagrams, W indicates a substrate such as a semiconductor wafer and a liquid crystal panel, L indicates a treatment liquid such as an etchant, and D indicates a liquid sealed liquid such as pure water and a treatment liquid.

The substrate treating device 10 includes a treatment portion 20 that provides wet treatment of the substrate W and the liquid feeding device 30 that feeds the treatment liquid L to the treatment portion 20.

The treatment portion 20 includes a treatment vessel 21. An outer partition wall 22 in a tubular shape is provided inside the treatment vessel 21. An inclined wall 22a inclined inward in a diameter direction is provided at an upper end of the outer partition wall 22. An inner partition wall 23 in a tubular shape is further provided in a position surrounding the partition wall 22.

A rotation table 24 feeding and holding the substrate W is provided on the inner side of the inner partition wall 23. A rotation axis 25a of a rotation driving source 25 is coupled to the underside of the rotation table 24.

A recovery pipe 26a is connected to the bottom of the treatment vessel 21 between the outer partition wall 22 and the inner partition wall 23 and also connected to a recovery line 71.

Also, a pipe 26b is connected to the bottom of the treatment vessel 21 on the outer side in the diameter direction of the outer partition wall 22 and on the inner side in the diameter direction of the inner partition wall 23. The pipe 26b is connected to an exhaust line (not shown). Accordingly, the treatment liquid L can be disposed of.

Further, a liquid injection nozzle 28 forming a feeding portion of a treatment liquid is arranged above the rotation table 24. A feeding line 63 from the liquid feeding device 30 is connected to the liquid injection nozzle 28.

The liquid feeding device 30 includes a first feeding tank 40A accommodating the treatment liquid L, a second feeding tank 40B accommodating the treatment liquid L, a feeding mechanism 60 that feeds the treatment liquid L from the first and second feeding tanks 40A, 40B to the treatment portion 20, a recovery mechanism 70 that returns the treatment liquid L recovered by the treatment portion 20 to the first and second feeding tanks 40A, 40B, and an internal circulation mechanism 80 that circulates the treatment liquid L in the first and second feeding tanks 40A, 40B.

The first feeding tank 40A includes, as shown in FIG. 2, a well-closed container 41, an exhaust passage 42 connected to the upper portion of the well-closed container 41, an overflow line 43 provided on the side face thereof, a treatment liquid replenishing portion 44 that feeds a concentrated treatment liquid into the well-closed container 41, a pure water replenishing portion 45 that feeds pure water into the well-closed container 41, a concentration sensor 46 that measures the concentration of the accommodated treatment liquid L, and a liquid sealing vessel 50 provided on the outer side of the overflow line 43. The exhaust passage 42 is provided with an on-off valve 42a. If the on-off valve 42a is closed, the exhaust passage 42 is airtightly blocked and if the on-off valve 42a is opened, the exhaust passage 42 is opened. The second feeding tank 40B also has the same structure and a detailed description thereof is omitted by attaching the same reference signs to the same functional portions.

The liquid sealing vessel 50 includes a well-closed container 51 accommodating a liquid sealed liquid D such as pure water or a treatment liquid, an overflow line 53 provided on the side face thereof, a discharge passage 54 connected to the bottom thereof, a liquid level sensor 55 that detects the liquid level of the liquid sealed liquid D, and a replenishment tank 56 that replenishes the well-closed container 51 with the liquid sealed liquid D from outside when the liquid level detected by the liquid level sensor 55 falls below a reference value. The liquid level sensor 55 and the replenishment tank 56 constitutes a liquid sealed liquid replenishing mechanism that replenishes the liquid sealed liquid D when the liquid sealed liquid D falls below a predetermined liquid level.

The well-closed container 51 includes a wall 51a provided by being suspended from a ceiling portion thereof. The inside of the well-closed container 51 is partitioned into an entrance side connected to the overflow line 43 and an exit side connected to the overflow line 53 by the wall 51a. The wall 51a extends to the liquid surface of the liquid sealed liquid D when the liquid sealed liquid D exceeds the predetermined liquid level. The discharge passage 54 is provided with an on-off valve 54a.

The feeding mechanism 60 includes branch feeding lines 61, 62 connected to the bottoms of the first and second feeding tanks 40A, 40B respectively, a feeding line 63 connected to these branch feeding lines 61, 62, on-off valves 61a, 62a provided halfway through the branch feeding lines 61, 62 respectively, and a pump 64 provided halfway through the feeding line 63. The other end of the feeding line 63 is connected to the liquid injection nozzle 28 of the treatment portion 20.

The recovery mechanism 70 includes a recovery line 71 connected to the recovery pipe 26a, a recovery tank 72 provided in the recovery line 71, a pump 73 connected to the bottom of the recovery tank 72, branch recovery lines 74, 75 connected to the first and second feeding tanks 40A, 40B after branching from the recovery line 71 respectively, and on-off valves 74a, 75a provided in these branch recovery lines 74, 75 respectively. Incidentally, the recovery tank 72 is provided with a liquid level sensor 72a.

The recovery tank 72 is arranged below the treatment vessel 21. Thus, the treatment liquid L at the bottom of the treatment vessel 21 is recovered by the recovery tank 72 by a gravity drop after passing through the recovery line 71 from the recovery pipe 26a. If the recovery tank 72 is installed anywhere other than below the treatment vessel 21, a configuration in which a pump is added to the recovery line 71 may be adopted.

The internal circulation mechanism 80 includes branch circulation lines 81, 82 connected to the bottoms of the first and second feeding tanks 40A, 40B respectively, a pump 83 connected to these branch circulation lines 81, 82, a disposal line 84 connected to the pump 83, on-off valves 81a, 82a provided halfway through the branch circulation lines 81, 82 respectively, an on-off valve 84a provided halfway through the disposal line 84, a circulation line 85 connected to an output port of the pump 83, branch circulation lines 86, 87 connected to the first and second feeding tanks 40A, 40B after branching from the circulation line 85 respectively, and on-off valves 86a, 87a provided in the branch circulation lines 86, 87 respectively.

Each on-off valve and the liquid sealing vessel 50 constitute an on-off mechanism. Each on-off each pump, each sensor, and the feeding portion of each treatment liquid are connected to a control device 200 for opening/closing, driving, or input/output. The control device 200 has a function to switch between a "feeding Mode" and a "standby mode" between the first feeding tank 40A and the second feeding tank 40B. That is, when one feeding tank is in the "feeding mode", the other feeding tank is in the "standby mode".

In the first feeding tank 40A, when the "feeding mode" is set, the on-off valve 61a, the on-off valve 42a, and the on-off valve 74a are opened and also the pump 64 is driven. When the liquid surface of the treatment liquid L detected by the liquid level sensor 72a provided in the recovery tank 72 reaches a predetermined level, the treatment liquid L is brought back to the first feeding tank 40A by driving the pump 73. Incidentally, the treatment liquid L may directly be brought back to the first feeding tank 40A by driving the pump 73 without being stored in the recovery tank 72. The on-off valve 42a is opened during the "feeding mode" to prevent a negative pressure inside the well-closed container 41 when the treatment liquid L inside the well-closed container 41 is pulled out by driving the pump 64. Incidentally, the on-off valves 81a, 86a are closed during the "feeding mode".

With the above settings, the treatment liquid L in the first feeding tank 40A circulates in the following route. That is, when the on-off valve 61a is opened and the pump 64 is operated, the treatment liquid L in the first feeding tank 40A reaches the pump 64 by passing through the branch feeding line 61 and the on-off valve 61a. The pump 64 is operating and thus, the treatment liquid L is fed to the substrate W by further passing through the feeding line 63 and the liquid injection nozzle 28. Further, the treatment liquid L scattered from the substrate W and stored at the bottom of the treatment vessel 21 is recovered to the recovery tank 72 by passing through the recovery pipe 26a and the recovery line 71. Further, the treatment liquid L is brought back to the first feeding tank 40A by the operation of the pump 73 by passing through the branch recovery line 74 and the on-off valve 74a.

In the first feeding tank 40A, on the other hand, when the "standby mode" is set, the on-off valve 61a, the on-off valve 42a, and the on-off valve 74a are all closed. Excluding a case of an internal circulation operation of the treatment liquid described later, the on-off valves 81a, 86a are also closed during the "standby mode".

In the second feeding tank 40B, when the "feeding mode" is set, the on-off valve 62a, the on-off valve 42a, and the on-off valve 75a are opened and also the pump 64 is driven. When the liquid surface of the treatment liquid L detected by the liquid level sensor 72a provided in the recovery tank 72 reaches a predetermined level, the treatment liquid L is brought back to the second feeding tank 40B by driving the pump 73. Incidentally, the treatment liquid L may directly be brought back to the second feeding tank 40B by driving the pump 73 without being stored in the recovery tank 72. Incidentally, the on-off valves 82a, 87a are closed during the "feeding mode".

In the second feeding tank 40B, on the other hand, when the "standby mode" is set, the on-off valve 62a, the on-off valve 42a, and the on-off valve 75a are all closed. Excluding a case of an internal circulation operation of the treatment liquid described later, the on-off valves 82a, 87a are also closed during the "standby mode".

When the treatment liquid L inside the first feeding tank 40A becomes low or is degraded, the control device 200 sets the first feeding tank 40A to the "standby mode" and the second feeding tank 40B to the "feeding mode". Accordingly, in the same manner as described above, the treatment liquid L is fed from the second feeding tank 40B to the treatment portion 20 and then recovered. A decrease of the treatment liquid L is detected by a liquid level sensor 47 provided on each side face of the feeding tanks 40A, 40B. The control device 200 determines that the treatment liquid is degraded when the number of substrates W treated by the treatment portion 20 reaches the number preset by the control device 200.

In the first feeding tank 40A set to the "standby mode", on the other hand, as described above, the on-off valves 61a, 42a, 74a are closed. Incidentally, in the first feeding tank 40A set to the "standby mode", an adjustment operation, disposal operation, or internal circulation operation of the treatment liquid L is performed for the treatment liquid L that is low in quantity or degraded.

Here, the adjustment, disposal, and internal circulation will be described in detail. The adjustment can be divide into a concentration adjustment operation and a quantity adjustment operation.

The concentration adjustment operation is an operation in which the concentration of the treatment liquid L inside the first feeding tank 40A is measured by the concentration sensor 46 and at least one of a concentrated treatment liquid from the treatment liquid replenishing portion 44 and pure water from the pure water replenishing portion 45 is appropriately fed so that the concentration falls within a predetermined concentration range.

The quantity adjustment operation is an operation that adjusts the feed rate from the treatment liquid replenishing portion 44 and the pure water replenishing portion 45 so that the liquid level detected by the liquid level sensor 47 provided in each feeding tank is equal to the reference value.

The disposal operation is an operation in which whether the number of treated substrates W has reached the number preset by the control device is determined before concentration adjustments or quantity adjustments are made and if the number has reached the preset number, the valves 81a, 84a are opened and the pump 83 is driven to dispose of the treatment liquid L inside the feeding tank 40A through the disposal line 84.

The internal circulation operation is an operation to stir when a concentrated treatment liquid and pure water are fed from the treatment liquid replenishing portion 44 and the pure water replenishing portion 45 to the feeding tank 40A in the concentration adjustment operation or the quantity adjustment operation. That is, the on-off valves 81a, 86a are opened, the valve 84a is closed, and the pump 83 is driven. Accordingly, the treatment liquid L in the first feeding tank 40A is circulated in the order of the on-off valve 81a, the branch circulation line 81, the pump 83, the circulation line 85, the branch circulation line 86, the on-off valve 86a, and the first feeding tank 40A. During the circulation operation, the treatment liquid L remaining in the feeding tank 40A and a concentrated treatment liquid and pure water newly fed to the first feeding tank 40A are stirred.

The circulation operation starts, for example, when a concentration adjustment or quantity adjustment operation starts and ends when a time preset by the control device 200 passes after the quantity adjustment operation ends. When the circulation operation ends, the on-off valves 81a, 86a are closed and the pump 83 is stopped. Next, the on-off valve 81a and the on-off valve 86a are closed to change to the "standby mode" in which the treatment liquid L is not exposed to the atmosphere.

The substrate treating device 10 configured as described above feeds the treatment liquid L, treats the substrate W, and recovers the treatment liquid L as described below.

A concentrated treatment liquid and pure water are fed from the treatment liquid replenishing portion 44 and the pure water replenishing portion 45 to the first and second feeding tanks 40A, 40B to adjust the treatment liquid L to a predetermined concentration based on the value detected by the concentration sensor 46. The concentration of the treatment liquid L is always measured by the concentration sensor 46 and a concentrated treatment liquid and pure water are appropriately fed from the treatment liquid replenishing portion 44 and the pure water replenishing portion 45 so that the concentration thereof falls within a predetermined concentration range. When a concentrated treatment liquid or pure water is fed, the concentration is made uniform by circulating the treatment liquid L to stir the treatment liquid.

On the other hand, the well-closed container 51 of the liquid sealing vessel 50 is replenished with the liquid sealed liquid D from the replenishment tank 56 until the liquid level sensor 55 is exceeded. Accordingly, a space above the liquid sealed liquid D is partitioned into an entrance side and an exit side so that the treatment liquid L inside the first and second feeding tanks 40A, 40B can be prevented by the wall 51a from being exposed directly to the outside air through the overflow line 43. Incidentally, when the liquid sealed liquid D accommodated in the well-closed container 51 reaches the entrance of the overflow line 53, the liquid sealed liquid D is discharged to the outside. If the liquid sealed liquid D is degraded, the liquid sealed liquid D is always maintained at a certain level of quality by discharging the liquid sealed liquid D by opening the on-off valve 54*a*.

Next, the substrate W to be treated by the treatment liquid L fed as described below is placed on the rotation table 24. The rotation driving source 25 is activated to rotate the rotation table 24. When the treatment of the substrate W is completed, the next substrate W is placed and the rotation table 24 is rotated and this process is common and the subsequent description thereof is omitted.

Next, the control device 200 sets the first feeding tank 40A to the "feeding mode" and the second feeding tank 40B to the "standby mode".

In the first feeding tank 40A in the "feeding mode", the on-off valve 61*a*, the on-off valve 42*a*, and the on-off valve 74*a* are opened and the pump 64 is driven to feed the treatment liquid L from the first feeding tank 40A to the liquid injection nozzle 28 through the feeding line 63. The treatment liquid L fed by the liquid injection nozzle 28 treats the substrate W acting thereon. The excessive treatment liquid L is recovered from the recovery pipe 26*a* of the treatment vessel 21 to the recovery tank 72 through the recovery line 71. When the recovered treatment liquid L is stored such that the liquid surface of the treatment liquid L detected by the liquid level sensor 72*a* is stored to reach a predetermined level, the recovered treatment liquid L is returned to the first feeding tank 40A by driving the pump 73.

In the second feeding tank 40B set to the "standby mode", when the accommodated treatment liquid L reaches the end of life, the on-off valve 82*a* and the on-off valve 84*a* are opened and the pump 83 is driven to discharge the treatment liquid L to the outside through the disposal line 84.

In the second feeding tank 40B in the "standby mode" in which the treatment liquid L is not degraded, the on-off valve 62*a*, the on-off valve 42*a*, and the on-off valve 75*a* are all closed.

When the treatment liquid L inside the first feeding tank 40A becomes low or is degraded, the control device 200 sets the first feeding tank 40A to the "standby mode" and the second feeding tank 40B to the "feeding mode". Accordingly, in the same manner as described above, the treatment liquid L is fed from the second feeding tank 40B to the treatment portion 20 and then recovered.

In the first feeding tank 40A, on the other hand, the treatment liquid L is adjusted, disposed of, or internally circulated. Next, the on-off valve 61*a*, the on-off valve 81*a*, and the on-off valve 86*a* are closed to be in the "standby mode" that does not expose the treatment liquid L to the outside air.

FIG. 3 is a diagram showing the concentration decline (degradation) of the treatment liquid L when, for example, an etchant is used as the treatment liquid L by comparing a case when exposed to the outside air (before measures: tank open system) and a case when not exposed to the outside air (after measures: tank closed system).

While the concentration declines rapidly before taking measures, the concentration declines slowly after taking measures. This is because nitrous acid as an etchant component of the treatment liquid L is vaporized by being exposed to the outside air. Incidentally, a cleaning fluid is also vaporized when exposed to the outside air and the concentration thereof declines.

By cutting off the feeding tank that is not serving to feed among a plurality of feeding tanks from the outside air in the liquid feeding device 30 in this manner, the degradation of the accommodated treatment liquid L is prevented to reduce the quantity consumed of the treatment liquid L. Therefore, the treatment cost can be reduced.

The present invention is not limited to the above embodiment. In the above example, for example, the internal circulation mechanism common to each feeding tank is provided, but the internal circulation mechanism may be provided for each feeding tank. The number of feeding tanks may be any number greater than one and is not limited to two. In addition, various modifications can naturally be made without deviating from the spirit of the present invention.

When the present invention is carried out, all feeding tanks may temporarily be in the "standby mode" depending on the operating conditions of the treating device.

A manometer 48 that detects the pressure inside the well-closed container 41 may also be included. In the feeding tank 40A, for example, if a concentrated treatment liquid and pure water are fed under pressure from the treatment liquid replenishing portion 44 and the pure water replenishing portion 45 to the well-closed container 41 while the on-off valve 42*a* is closed together with the on-off valves 61*a*, 74*a*, 81*a*, 86*a*, the pressure inside the well-closed container 41 rises. If, for example, the pressure rise continues and the manometer 48 detects that the pressure has reached the threshold preset for the control device 200 or more, the maintenance of airtightness inside the well-closed container 41 can be verified. That is, the treatment liquid L inside the feeding tank 40A is cut off from the outside air and is in a state in which the degradation thereof is prevented. In contrast, if the pressure rises only temporarily or does not reach the threshold (abnormal pressure), an occurrence of leakage can be estimated and non-maintenance of airtightness inside the well-closed container 41 can be perceived. In this case, it is preferable to notify the operator by operating an alarm device or the like.

As a cause of the above abnormal pressure, a case when the liquid level of the liquid sealed liquid D inside the liquid sealing vessel 50 has not yet reached a predetermined liquid level and the wall 51*a* has not yet reached the liquid sealed liquid D can be considered. In this case, the inside of the well-closed container 41 is communicatively connected to the atmosphere through the overflow lines 43, 53, leading to degradation of the treatment liquid L. As described above, the liquid level of the liquid sealed liquid D is detected by the liquid level sensor 55 and based on the detected value, the liquid level of the liquid sealed liquid D is always maintained up to the level where the wall 51*a* reaches the liquid surface of the liquid sealed liquid D. However, an abnormal pressure may arise due to a failure of the liquid level sensor 55 or if the replenishment of the treatment liquid from the replenishment tank 56 based on the output of the liquid level sensor 55 is insufficient. By including the manometer 48 that detects the pressure inside the well-closed container 41, such a problem can be detected at an earlier stage.

Further, in the configuration shown in, for example, FIG. 2, if the pressure inside the well-closed container 41 becomes abnormally high, the pressure pushes down the liquid sealed liquid D on the entrance side of the liquid sealing vessel 50, which pushes up the liquid sealed liquid D on the exit side of the liquid sealing vessel 50 by the amount being pushed down. Then, when the pushed-up liquid sealed liquid D reaches the entrance of the overflow line 53, the abnormal pressure is released by the liquid sealed liquid D being discharged to the outside. However, with decreasing fluidity of the liquid sealed liquid D inside the liquid sealing vessel 50 due to, for example, degradation, the liquid sealed liquid D becomes less movable even by the abnormal pressure. Given the circumstances, the pressure inside the well-closed container 41 cannot be released, leading to the deformation or destruction of the well-closed container 41. However, by including the manometer 48 that detects the pressure inside the well-closed container 41 to control the pressure, the deformation or destruction of the feeding tanks can be prevented.

INDUSTRIAL APPLICABILITY

According to the present invention, the life of a treatment liquid in a standby state accommodated in a feeding tank can be prolonged.

The invention claimed is:

1. A liquid feeding device that feeds a treatment liquid to a treating section and also recovers the treatment liquid for re-feeding, the device comprising:
   a plurality of feeding tanks that accommodate the treatment liquid, each including a closed container having an upper portion to which an exhaust passage is connected, and each switchable between a feeding mode in which the treatment liquid is fed and a standby mode in which the feeding tank is on standby while accommodating the treatment liquid;
   a feeding section configured to feed the treatment liquid to the feeding section from any one of the plurality of the feeding tanks in the feeding mode;
   a recovery section configured to recover and return excess treatment liquid in the treating section to any one of the plurality of the feeding tanks in the feeding mode; and
   an on-off valve device provided in each of the plurality of feeding tanks to block the exhaust passage,
   wherein the respective on-off valve device seals the exhaust passage of the respective feeding tank in the standby mode and opens the respective exhaust passage of the respective feeding tank in the feeding mode.

2. The liquid feeding device according to claim 1, comprising, for at least one feeding tank, an overflow line connected to a side face of the closed container, and a liquid sealing vessel, and the liquid sealing vessel is connected to the overflow line on an entrance side and to an outside air side on an exit side, accommodates the treatment liquid or pure water as a liquid-sealed liquid, and includes a wall that partitions the liquid sealing vessel into the entrance side and the exit side by extending at least to a liquid surface of the liquid-sealed liquid from a ceiling side.

3. The liquid feeding device according to claim 2, wherein the liquid sealing vessel is provided with a liquid level sensor and includes a liquid-sealed liquid replenishing section that replenishes the liquid-sealed liquid to the liquid vessel when the liquid-sealed liquid detected by the liquid level sensor falls below a predetermined liquid level.

4. The liquid feeding device according to claim 1, wherein each of the plurality of the feeding tanks comprises a concentration sensor that measures a concentration of the treatment liquid and includes a treatment liquid replenishing section that feeds the treatment liquid to the feeding tank when the concentration thereof detected by the concentration sensor falls below a predetermined concentration.

5. A substrate treating device that treats a substrate with a treatment liquid, the device comprising:
   a rotation table removably holding the substrate and driven to rotate the substrate;
   a feeding nozzle arranged above the rotation table to feed the treatment liquid to the substrate;
   a plurality of feeding tanks that accommodate the treatment liquid, each including a closed container having an upper portion to which an exhaust passage is connected, and switchable between a feeding mode in which the treatment liquid is fed and a standby mode in which the feeding tank is on standby while accommodating the treatment liquid;
   a feeding section configured to feed the treatment liquid to the feeding nozzle from any one of the plurality of the feeding tanks in the feeding mode;
   a recovery section configured to recover and return excess treatment liquid fed by the feeding nozzle to the substrate to any one of the plurality of the feeding tanks in the feeding mode; and
   an on-off valve device provided in each of the plurality of feeding tanks to block the exhaust passage,
   wherein the respective on-off valve device seals the exhaust passage of the respective feeding tank in the standby mode and opens the respective exhaust passage of the respective feeding tank in the feeding mode.

6. The substrate treating device according to claim 5, comprising, for at least one of the feeding tanks, an overflow line connected to a side face of the closed container, and a liquid sealing vessel, and the liquid sealing vessel is connected to the overflow line on an entrance side and to an outside air side on an exit side, accommodates the treatment liquid or pure water as a liquid-sealed liquid, and includes a wall that partitions the liquid sealing vessel into the entrance side and the exit side by extending at least to a liquid surface of the liquid-sealed liquid from a ceiling side.

7. The substrate treating device according to claim 6, wherein the liquid sealing vessel is provided with a liquid level sensor and includes a liquid-sealed liquid replenishing section that replenishes the liquid-sealed liquid to the liquid sealing vessel when the liquid-sealed liquid detected by the liquid level sensor falls below a predetermined liquid level.

8. The substrate treating device according to claim 5, wherein the recovery section comprises a recovery tank arranged below the rotation table.

9. The substrate treating device according to claim 5, comprising, for each of the plurality of feeding tanks, a treatment liquid replenishing section that feeds the treatment liquid into the closed container, and a pure water replenishing sections that feeds pure water into the closed container.

10. The substrate treating device according to claim 5, comprising, for each of the plurality of feeding tanks, a manometer that detects a pressure inside the closed container, and a control section that verifies airtightness inside the closed container based on a pressure value that the manometer detects when the treatment liquid and the pure water are fed under pressure from the treatment liquid replenishing section and the pure water replenishing section to the closed container while the on-off valve device seals the exhaust passage in the standby mode.

11. The substrate treating device according to claim 5, wherein the recovery section recovers the treatment liquid used in the feeding nozzle to a recovery tank, and returns the treatment liquid to the respective feeding tank in the feeding mode when in the recovery tank a liquid surface of the treatment liquid detected by a liquid level sensor provided in the recovery tank reaches a predetermined level.

12. The substrate treating device according to claim 5, comprising a feeding line communicating with the closed containers that constitutes the feeding section used when feeding the treatment liquid to the feeding nozzle and anindependent circulation line controllable to circulate the treatment liquid in the closed containers while the exhaust passage is sealed in the standby mode.

* * * * *